(12) United States Patent
Krasner

(10) Patent No.: US 6,816,111 B2
(45) Date of Patent: Nov. 9, 2004

(54) CALIBRATION AND CORRECTION SYSTEM FOR SATELLITE POSITION LOCATION SYSTEMS

(75) Inventor: Norman Krasner, Emerald Hills, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 10/336,125

(22) Filed: Jan. 3, 2003

(65) Prior Publication Data

US 2004/0130484 A1 Jul. 8, 2004

Related U.S. Application Data

(60) Provisional application No. 60/433,138, filed on Dec. 13, 2002.

(51) Int. Cl.$^7$ ................................................. G01S 5/14
(52) U.S. Cl. ................................ 342/357.12; 342/357.1
(58) Field of Search ........................ 342/357.1, 357.12, 342/357.15

(56) References Cited

U.S. PATENT DOCUMENTS

| | | | | |
|---|---|---|---|---|
| 4,445,118 A | | 4/1984 | Taylor et al. ............... 343/357 |
| 5,623,414 A | | 4/1997 | Misra ...................... 364/449.1 |
| 5,841,396 A | * | 11/1998 | Krasner .................. 342/357.02 |
| 6,002,363 A | | 12/1999 | Krasner ................... 342/357.1 |
| 6,111,540 A | | 8/2000 | Krasner ................... 342/357.1 |
| 6,122,506 A | * | 9/2000 | Lau et al. .................... 455/427 |
| 6,133,871 A | | 10/2000 | Krasner .................. 342/357.06 |
| 6,184,829 B1 | | 2/2001 | Stilp .......................... 342/387 |
| 6,208,290 B1 | | 3/2001 | Krasner ................. 342/357.05 |
| 6,281,834 B1 | | 8/2001 | Stilp .......................... 342/174 |
| 6,317,081 B1 | | 11/2001 | Stilp .......................... 342/387 |
| 6,407,699 B1 | | 6/2002 | Yang ..................... 342/357.12 |
| 2001/0034210 A1 | * | 10/2001 | Nir et al. ...................... 455/71 |
| 2003/0068977 A1 | * | 4/2003 | King ......................... 455/12.1 |
| 2003/0176204 A1 | * | 9/2003 | Abraham ................. 455/556.1 |
| 2003/0214436 A1 | * | 11/2003 | Voor et al. ................... 342/418 |

* cited by examiner

*Primary Examiner*—Gregory C. Issing
(74) *Attorney, Agent, or Firm*—Philip Wadsworth; Charles Brown; Richard Bachand

(57) ABSTRACT

To provide accurate and quick position measurements in a practical mobile position location system, the GPS receiver is calibrated, a frequency error in the next time period is predicted using a first frequency locked to an externally transmitted signal, and a second frequency is generated by a GPS oscillator. To predict the error in the next time period, several measurements are made over time, error estimations are made, an error function is approximated responsive to the set of error estimations. This predicted error is then used to correct the GPS receiver in the next time period. In one implementation, a multiple function portable device is disclosed for providing cellular communication using a network of cellular stations that operate at predefined ideal cellular frequencies, and also for providing position location using GPS satellites that transmit GPS signals at a predefined GPS frequency.

24 Claims, 9 Drawing Sheets

Typical Cellular and GPS Oscillator Drifts Under Stressed Conditions

Ratio of GPS Oscillator Frequency to Cellular Oscillator Frequency

Error Estimations for Successive Intervals

Frequency Correction Curve From Fit to Error Measurements

Linear Slope Estimate Due to Instantaneous +100 Hz –100 Hz Frequency Jump (Within 1 Second)

Linear Slope Estimate As Seen by Vehicle Traveling 60 MPH Next to Cell Tower 15 Meters from Highway, 15 Meters High Linear Slope Estimate for Random Frequency Data Normally Distributed
With RMS 50 Hz (12 Calibration Measurements Averaged)

CALIBRATION AND CORRECTION SYSTEM FOR SATELLITE POSITION LOCATION SYSTEMS

RELATED APPLICATION

This application claims priority to U.S. Provisional Application Ser. No. 60/433,138, filed on Dec. 13, 2002.

BACKGROUND OF THE INVENTION

1. Field of the Invention

This invention relates to an apparatus and method for computing the position of a mobile device by use of wireless signals, such as GPS systems.

2. Description of Related Art

Existing position location technologies based on GPS use a network of satellites that transmit signals at a predefined GPS frequency at a known time. A GPS receiver on the ground measures the times of arrival of the signals from each satellite in the sky it can "see". The times of arrival of the signals along with the exact location of the satellites and the exact times the signals were transmitted from each satellite are used to triangulate the position of the GPS receiver. A standard GPS receiver includes a local oscillator that is used to receive the GPS signals from the satellites.

The acquisition of signals from the GPS satellites is highly sensitive to frequency variations in the local oscillator of the GPS receiver. A number of factors contribute to making the acquisition of the GPS signals difficult. The GPS signals are transmitted at a relatively low power, and the GPS satellites are in earth orbit. By the time the GPS signals reach the ground, their initially low power has been greatly reduced, making the signal extremely weak. As a result, if the GPS receiver's local oscillator frequency is even slightly off the GPS frequency, it may be difficult and time consuming to effectively receive the GPS signals.

In many communication systems, including GPS receiving systems, there exists a primary local oscillator, called a "reference local oscillator". The output signal of the reference local oscillator is in turn fed to one or more frequency synthesis circuits, which in turn produce additional signals at other frequencies that are provided to various circuits in such systems. As an example, it is common for GPS receiving systems to utilize a reference local oscillator with a nominal output frequency of 16.368 MHz. This oscillator output is typically fed to a frequency synthesis circuit that uses the reference frequency to produce a local oscillator frequency in the vicinity of 1575.42 MHz, which in turn is used in a downconverter circuit that translates the input GPS signals to near baseband. Similarly this reference oscillator output may be used to synthesize a sample clock, often with a frequency being a multiple of 1.023 MHz, where this sample clock is used as part of a digitizing circuit that samples the near-baseband translated GPS signal. Similarly, in cellphone receivers, a reference oscillator often has a frequency of oscillation in the 10 MHz to 20 MHz range (depending upon design), which is used to produce additional frequencies for purposes of signal down conversion and sampling.

In some situations it may be advantageous for a GPS system to utilize a frequency calibration method such as disclosed in U.S. Pat. Nos. 5,841,396, 6,421,002, and others. In one approach, the average frequency of the cell phone's local oscillator (VCTCXO) is measured, and used to calibrate the frequency error of the GPS receiver's oscillator. This VCTCXO is typically frequency locked to the highly stable received cellular signal. An alternative approach is to frequency lock the GPS oscillator to the cell phone's local oscillator. This latter approach suffers in performance if the short term stability of the cell phone's oscillator is poor. Such cell phone oscillator stability is dependent upon a number of factors, such as the cell phone design, and platform motion.

The calibration method sometimes suffers performance problems, including:

(A) frequency "racing" problems due to heating/cooling associated with the cell phone's transmitter turning on/off;

(B) frequency variation due to voltage fluctuations, again associated with the cell phone's transmitter turning on/off; and (C) other heating/cooling situations due to environmental effects.

Although the above calibration measurement method may work adequately in a platform that is static or moving at relatively slow speeds, such as pedestrian speeds, rapid frequency fluctuations of the cellular oscillator observed in vehicular usage will cause the performance of the calibration to deteriorate. That is, because the cellular oscillator is frequency locked to the network, rapid fluctuations in received frequency of the cellular signal may cause large errors in calibration. Such rapid fluctuations may occur, for example, when a vehicle is approaching a serving cell base station and then passes the station. During this short time, the observed frequency of the direct pilot from this cell base station may rapidly change from a large positive Doppler (e.g. +100 Hz) to a large negative Doppler (e.g. −100 Hz) in a matter of a second or several seconds. This rapid variation in received cellular carrier frequency, coupled with a cell phone transmitter being turned on or off, may cause a deterioration of the efficacy of the frequency-locked calibration method.

SUMMARY OF THE INVENTION

To provide accurate and quick position measurements in a practical mobile position location device, a system described herein calibrates a GPS receiver by predicting a frequency error in the next time period responsive to a first frequency locked to an externally transmitted signal and a second frequency generated by a GPS oscillator. Particularly, the calibration system makes several measurements over time, estimates an error in each measurement, approximates an error function, and predicts an error for the next time period. The predicted error is then used to correct the GPS receiver in the next time period.

A method and apparatus is disclosed for calibrating and correcting a GPS receiver in the mobile device using an externally transmitted signal (other than a GPS signal) that has a predefined precision carrier frequency. To receive the GPS signal transmitted at a predefined GPS frequency, the method includes generating a first frequency signal responsive to the precision carrier frequency, and generating a second frequency signal in the GPS receiver that is applied to process the GPS signal. For example, the first frequency may be a subharmonic of the frequency received by a cellular receiver, and the second frequency signal may be generated, directly by a reference GPS oscillator in the GPS receiver, or it may be derived from a reference GPS oscillator. The calibration method includes estimating an error between the first and second frequencies in a first time period, repeating the error estimating step for at least one additional time period to provide a set of error estimations, approximating an error function of the second frequency responsive to the set of error estimations, and predicting an error in a next time period utilizing the approximated function. A correction signal is generated, and an oscillator in the GPS receiver is corrected in the next time period to process the GPS signal responsive to the predicted error.

Typically, the calibration method includes repeatedly measuring a ratio of the second and the first frequencies over a plurality of time periods, and for each time period comparing this ratio to a predetermined number to estimate the error respectively for each time period. The error prediction step typically includes determining a frequency error vs. time of the second frequency by fitting a mathematical function responsive to the set of error estimations, such as by averaging the set of error estimations, and performing a mathematical regression method utilizing the set of error estimations to produce a least-mean-square fit to the set of error estimations.

In some disclosed methods, the correcting step includes correcting a GPS local oscillator that supplies the second frequency to convert the GPS signal at the GPS frequency into a predetermined intermediate frequency, and in other disclosed methods the GPS receiver comprises a digital processing system that includes a digital local oscillator, and the correcting step includes correcting the digital local oscillator.

In one implementation, a multiple function portable device is disclosed for providing cellular communication using a network of cellular stations that operate at predefined ideal cellular frequencies, and also for providing position location using GPS satellites that transmit GPS signals at a predefined GPS frequency. The multi-function portable device comprises a cellular communication system including a first local oscillator that generates a first frequency for demodulating communications with the network of cellular stations, a GPS system including a second local oscillator that generates a second frequency coupled to process the GPS signals, an error prediction and correction system that predicts an error in a next time period responsive to measurements of the first and second frequencies over a plurality of previous time periods, the system also generating a correction signal for the next time period responsive to the predicted error, and a local oscillator in the GPS system that receives the correction signal and responsive thereto processes the GPS signal during the next time period.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION

Figure 1:
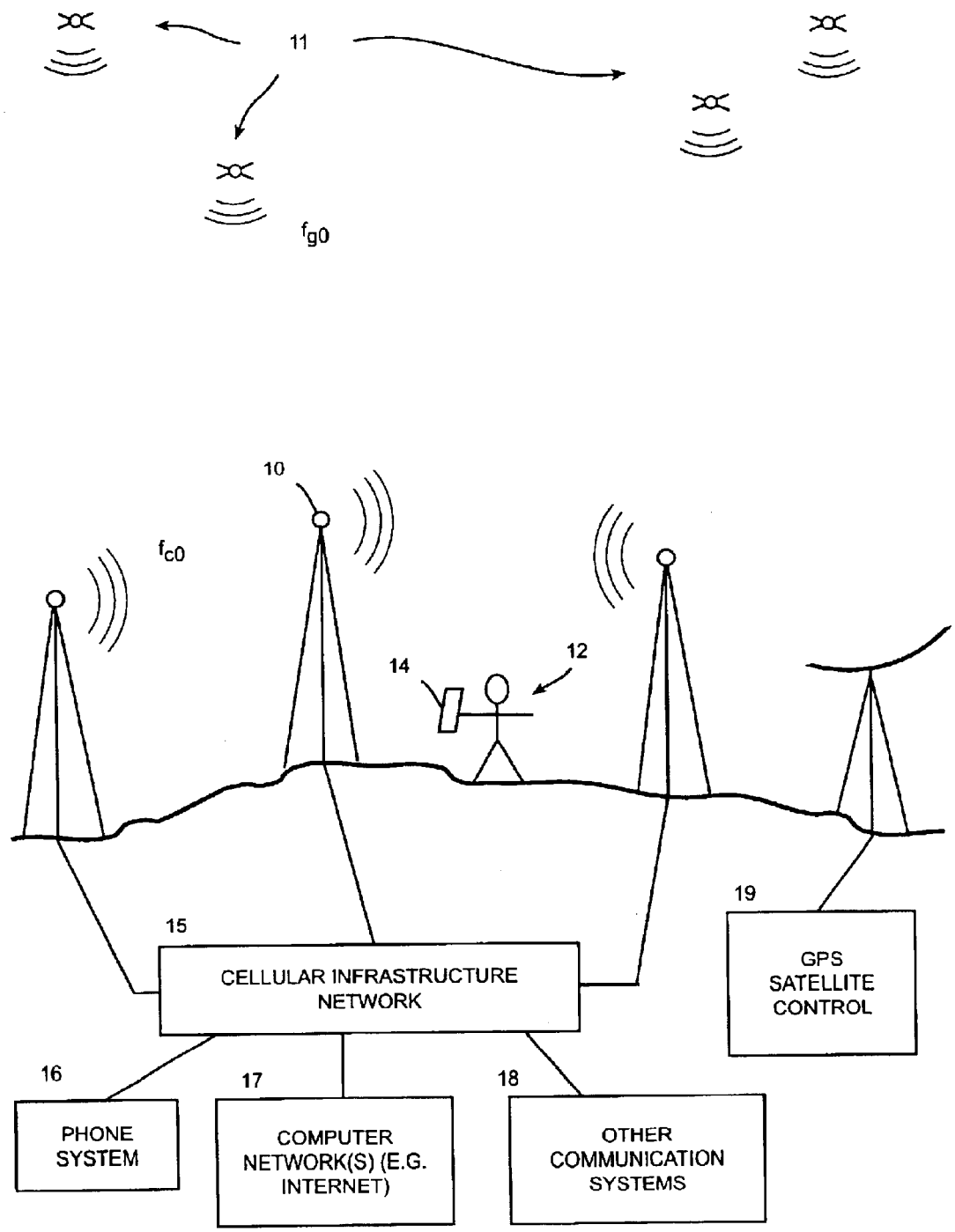
FIG. 1 is a perspective view of a plurality of cellular base stations, GPS satellites, and a user holding a mobile device such as a cell phone.

This invention is described in the following description with reference to the figures, in which like numbers represent the same or similar elements.

Glossary of Terms and Acronyms

The following terms and acronyms are used throughout the detailed description:

Base Station A station that transmits a precision carrier frequency, such as a cell site in a cellular phone network.

Calibration A process that relates to measuring errors at the present time and predicting errors at a future time.

Correction A method that relates to compensating for errors predicted in the calibration process.

CDMA Code Division Multiple Access

FSK Frequency Shift Keying

GPS Global Positioning System Although the term GPS is often taken to mean the United States Global Positioning System, the meaning of this term herein and the methods of all apparatus described herein apply equally well to other Global Positioning Systems, such as the Russian Glonass System and the planned European Galileo System. In some systems, the term Satellite Positioning System (SPS) is used in substitution for the GPS terminology.

GSM Global System for Mobile Communications

Mobile Device A portable device, such as a cell phone, typically carried by a user whose location is to be determined.

Multi-function Device A device that has two or more operating functions, such as a GPS system and a cellular communication system.

Pilot Signal A signal, typically modulated by a psuedo-random sequence, emitted by a cellular station for the purpose of establishing communication with remote devices. Although the term "pilot" is often used in the context of CDMA cellular systems, this term also applies broadly herein to all other cellular communication systems.

Precision Carrier Frequency A highly predictable, accurate frequency that is transmitted from an external source. A precision carrier frequency can be emitted directly by the external source, or it may be derivable from the signal emitted from the external source, such as disclosed in U.S. Pat. No. 6,421,002.

Table of Variables

Following is a table that sets forth some of the variables discussed herein:

| Variable | Description |
| --- | --- |
| δf | difference between the ideal frequency and the actual (for either cellular or GPS frequencies) |
| $f_c$ | actual cellular oscillator frequency (e.g. first oscillator frequency) |
| $f_{c0}$ | ideal cellular oscillator frequency (e.g. a precision carrier frequency) |
| $f_g$ | GPS oscillator frequency (e.g. second oscillator frequency) |
| $f_g^*$ | GPS mixing frequency supplied by frequency synthesizer in one embodiment |
| $f_{g0}$ | ideal GPS oscillator frequency |
| $f_1$ | initial GPS oscillator frequency at time t = 0 (e.g. 16.368 MHz) |
| $f_2$ | initial cellular oscillator frequency at time t = 0 (e.g. 19.2 MHz) |
| R | the measured ratio between the first and second oscillator frequencies |
| $R_0$ | the ideal ratio between the cellular and GPS oscillator frequencies |
| S | scale factor used as a correction signal in one embodiment |

As described in the background section, the reference frequency from a reference local oscillator may be used to synthesize (or more generally, derive) other frequencies for use in the system. For description purposes for some embodiments herein we may utilize the terminology "local oscillator", or "oscillator", which in one embodiment is synonymous with the reference local oscillator. However, alternative embodiments may associate the term "local oscillator" or "oscillator" with any oscillation signals derived from such a reference local oscillator via a frequency synthesis procedure, for example. Since such derived signals have average frequencies that bear a known relationship relative to that of the reference oscillator, it is straightforward to apply the methods and apparatus of this invention to any of these oscillators' outputs. Hence in this invention description the term "local oscillator" or "oscillator" is defined broadly to include the reference oscillator or any oscillator whose frequency is derived from the reference oscillator. Similarly when we utilize the term "oscillator frequency" we mean that of the reference oscillator or that of any oscillator whose frequency is derived from the reference oscillator. In a multi-function communication device, such as a combined cellphone transceiver and GPS receiver, there may be two or more reference oscillators, e.g. one for the cellphone circuitry and one for the GPS circuitry. We use the terminology GPS local oscillator and cellphone local oscillator to distinguish between the different oscillator chains.

We should also note that a reference oscillator may have a slightly variable frequency, where such frequency may be controlled in some fashion in order to compensate for various errors relative to an ideal frequency. For example in cellphones it is common to utilize a Voltage Controlled Temperature Compensated Crystal Oscillator (VCTCXO) as a frequency reference. Here, a compensation procedure is used in which a highly stable received cellular signal is used to measure and correct errors in the VCTCXO's frequency. Also, a temperature measurement circuit is used to compensate for frequency errors that result as a function of ambient temperature fluctuations.

Overview

As discussed in the Background, rapid variations in the received cellular oscillator frequency, which may coincide with a cell phone transmitter being turned on or off, may cause a deterioration of the efficacy of a calibration method in which a GPS local oscillator is calibrated using an external precision carrier frequency observed by the cellular system's local oscillator. Using the system described herein, calibration of a GPS oscillator can be improved by observing frequency variations in local oscillator frequencies of the cell phone and/or the GPS system over a sufficiently long time period. As described herein, a frequency comparison process can be performed periodically, perhaps at 0.5 to 1.0 second intervals, to yield a set of observations. Then these observations (e.g. the 10 to 20 most recent observations) can be used to determine frequency rate of change vs. time utilizing curve-fitting techniques such as linear (or higher order) regression. This process can yield an error prediction that is then used to calibrate a local oscillator in the GPS system, which will tend to smooth out errors that result from a rapid frequency jump, such as a +100 to −100 Hz frequency jump that may occur when a mobile device in a car travels by a cell base station.

The method and apparatus disclosed herein is useful in the situation in which the GPS oscillator frequency is drifting with respect to time. Hence the various errors and corrections discussed herein are functions of time, for example, as a result of rapid ambient temperature changes. As described herein, a multiplicity of such measurements (at least two) may then be used to predict the future GPS oscillator frequency vs. time, and hence allow for the correction of drifts to this oscillator. Typically, over relatively short periods of time (say 30 seconds), such drifts are well modeled as linear functions of time, and over longer periods, a $2^{nd}$ order curve fit (or even higher order fit) may be more appropriate. Derivation of a curve fit to the measurement error(s) as described herein allows compensation for such GPS oscillator drifts.

Description

FIG. 1 illustrates one environment in which the present invention can be implemented. In the illustrated environment, a GPS receiver and cell phone are implemented together in a mobile unit; however it should be apparent that the present invention could be used in other systems in which the frequency of a first oscillator locked to a precision carrier frequency is used to calibrate a second oscillator.

FIG. 1 shows a plurality of cellular base stations shown collectively at 10, GPS satellites shown collectively at 11, and a user 12 grasping a mobile device 14. As described in more detail with reference to FIG. 2, the mobile device 14 include a communication system such as a cell phone and a position location system such as a GPS system. The user 12 may be on foot as shown, or may be traveling in a car or on public transportation, for example.

The cellular base stations 10 comprise any collection of cellular base station utilized as part of a communication network for connection with the mobile device. The cellular base stations are connected to a cellular infrastructure network 15 that provides communication services with a plurality of other communication networks such as a public phone system 16, computer networks 17, such as the Internet, and other communication systems shown at 18. The cellular infrastructure network typically provides communication services that allow the user of a cell phone to connect to another phone using the phone system 16; however, the cellular base stations could also be utilized to communicate with other devices and/or for other communication purposes, such as an Internet connection with a handled personal digital assistant (PDA).

In one embodiment, the cellular base stations 10 are part of a CDMA communication network; however in other embodiments other types of communication networks, such as GSM networks, may be used. In CDMA systems each cellular station periodically emits a psuedo-random sequence that uniquely identifies the cell station. The psuedo-random sequence is a series of bits that are useful for the receiver to lock upon. In CDMA terminology this psuedo-random sequence is termed a "pilot signal"; as used herein, the term pilot signal can apply to any cellular system as well as to CDMA systems. For example, various synchronization signals are provided by GSM cellular stations. CDMA and GSM signals are transmitted from the cell stations at predefined, highly accurate frequencies, which provide precision carrier frequencies in one embodiment described herein.

The GPS satellites 11 comprise any group of satellites used for positioning a GPS receiver. The satellites communicate with a land-based GPS communication system 19, which provides control functions for the GPS system. The satellites are synchronized to periodically send out wireless signals at the same time. When these signals are detected by the GPS receiver, the GPS system calculates the amount of time it takes for the detected GPS signals to travel from their respective satellites to the receiver. This assumes that the GPS receiver has an accurate local clock. However the clock may be set by the received GPS signals themselves as long as four or more such signals are received simultaneously.

Figure 2:
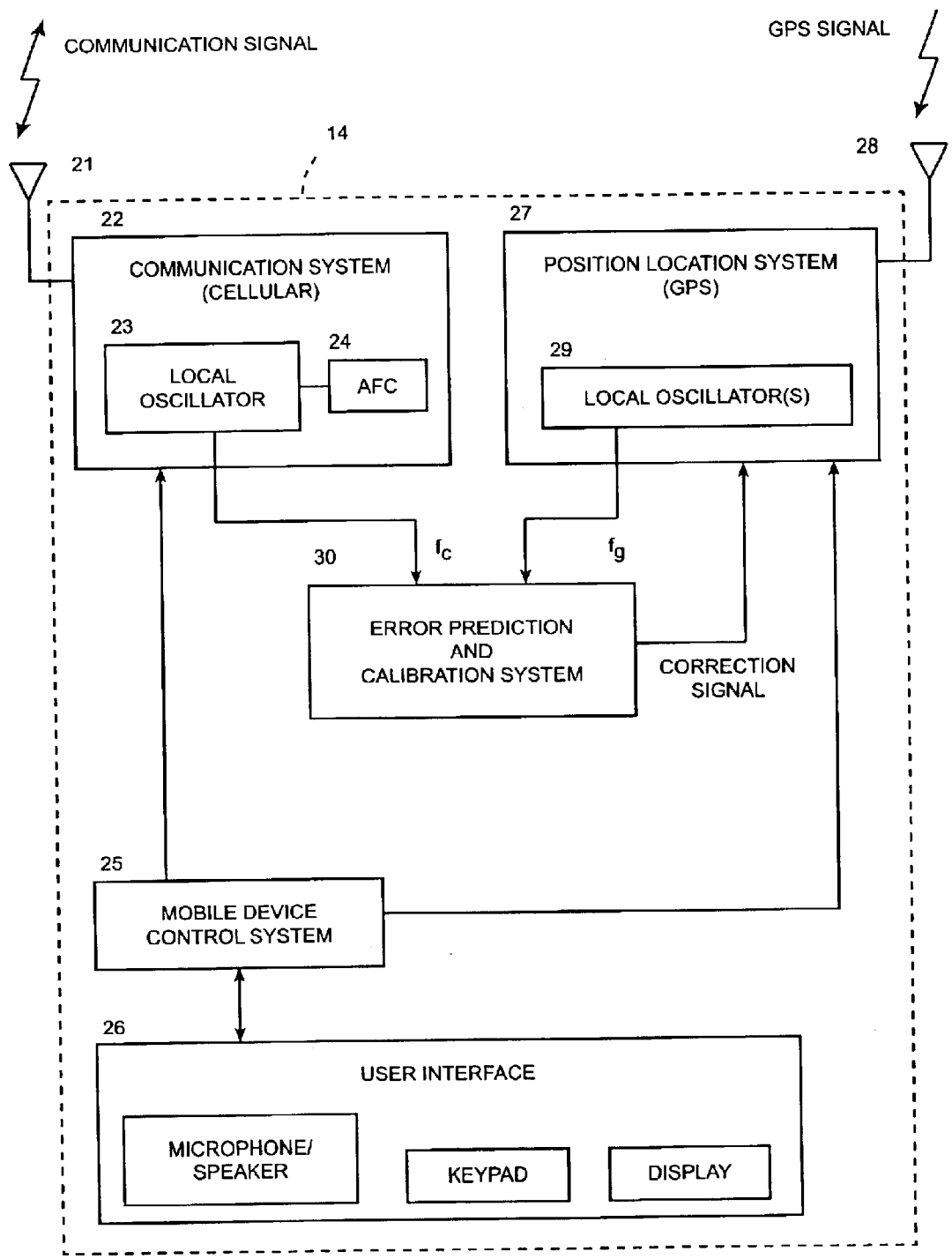
FIG. 2 is a block diagram of the mobile device in one embodiment that incorporates communication and position location systems.

FIG. 2 is a block diagram of one embodiment of the mobile device 14 incorporating communication and position location systems. FIG. 2 shows a cellular communication system 22 connected to an antenna 21. The cellular communication system 22 comprises suitable devices, hardware, and software for communicating with and/or detecting signals from cellular base stations, including a local oscillator 23 and an automatic frequency control (AFC) system 24 that locks the local oscillator 23 to cellular base frequency. Ideally this frequency is $f_{c0}$. As discussed above, although the local oscillator is locked to the received cellular base frequency under AFC control, the actual cell frequency $f_c$ generated by the local oscillator may be different than the ideal base frequency $f_{c0}$ for reasons such as movement of the mobile device. In other words, the transmitted base frequency and the actual local oscillator frequency might not be perfectly synchronized. The cellular communication system 22 is coupled to an error prediction and calibration system 30, thereby allowing transfer of data such as the cellular local oscillator frequency $f_c$, which is used for error prediction as described elsewhere in detail.

In one embodiment, the cellular communication system 22 comprises a CDMA communication system suitable for communicating with a CDMA network of base stations; however in other embodiments the cellular communication system may comprise another type of network such as GSM.

A mobile device control system 25 is connected to the communication system 22 and the position location system 27. The mobile device control system 25 includes any appropriate structure, such as a microprocessor, memory, other hardware, firmware, and software to provide appropriate control functions for the systems to which it is connected. The control system 25 is connected to a user interface 26, which includes any suitable components to interface with the user, such as a keypad, a microphone/speaker for voice communication services, and a display such as a backlit LCD display. The mobile device control system 25 and user interface 26 are connected to the position location system 27, to provide suitable function for the GPS receiver, such as user input control and displaying results.

Figure 3:
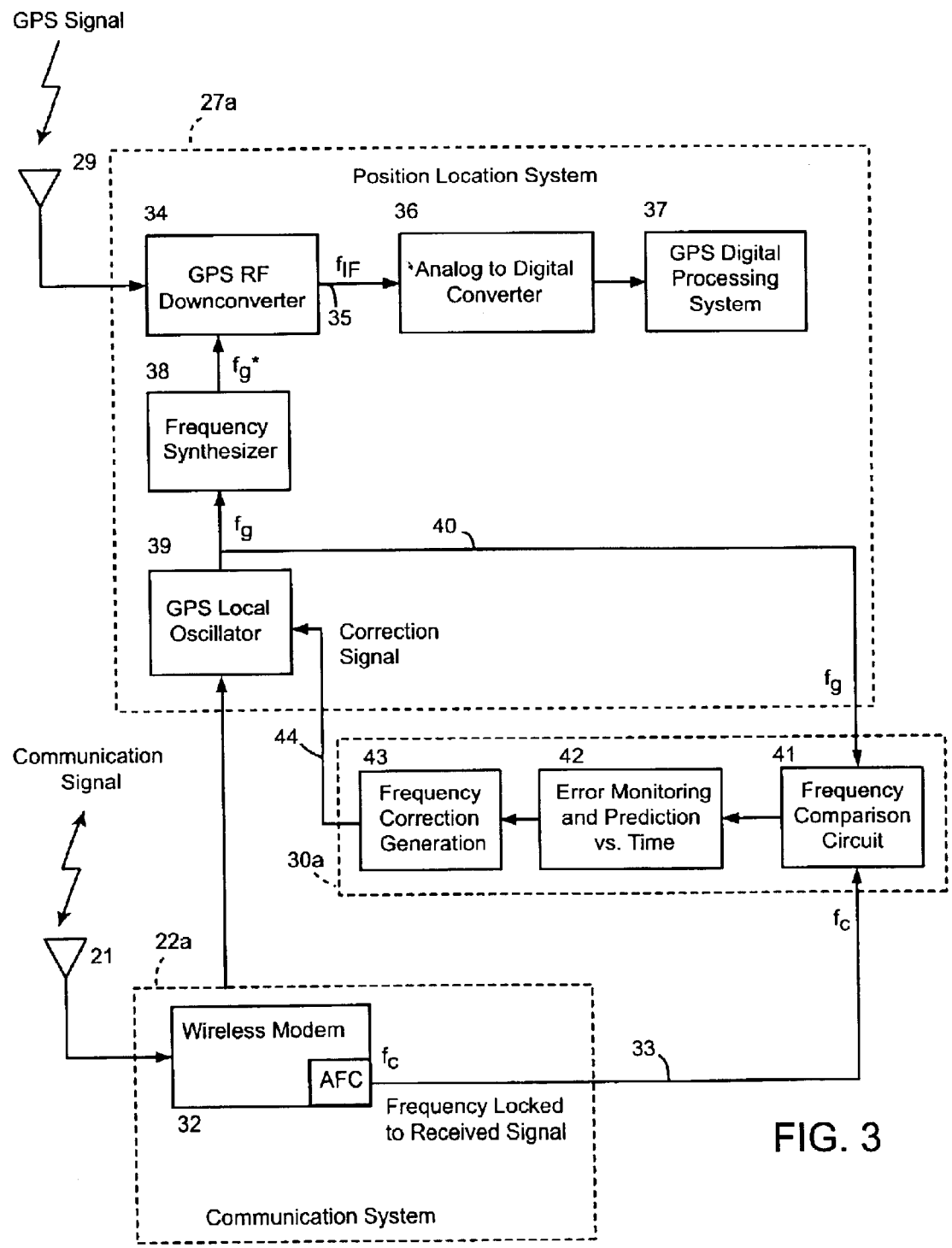
FIG. 3 is a block diagram of one embodiment of the communication system, position location system, and the error prediction and calibration system.
Figure 4:
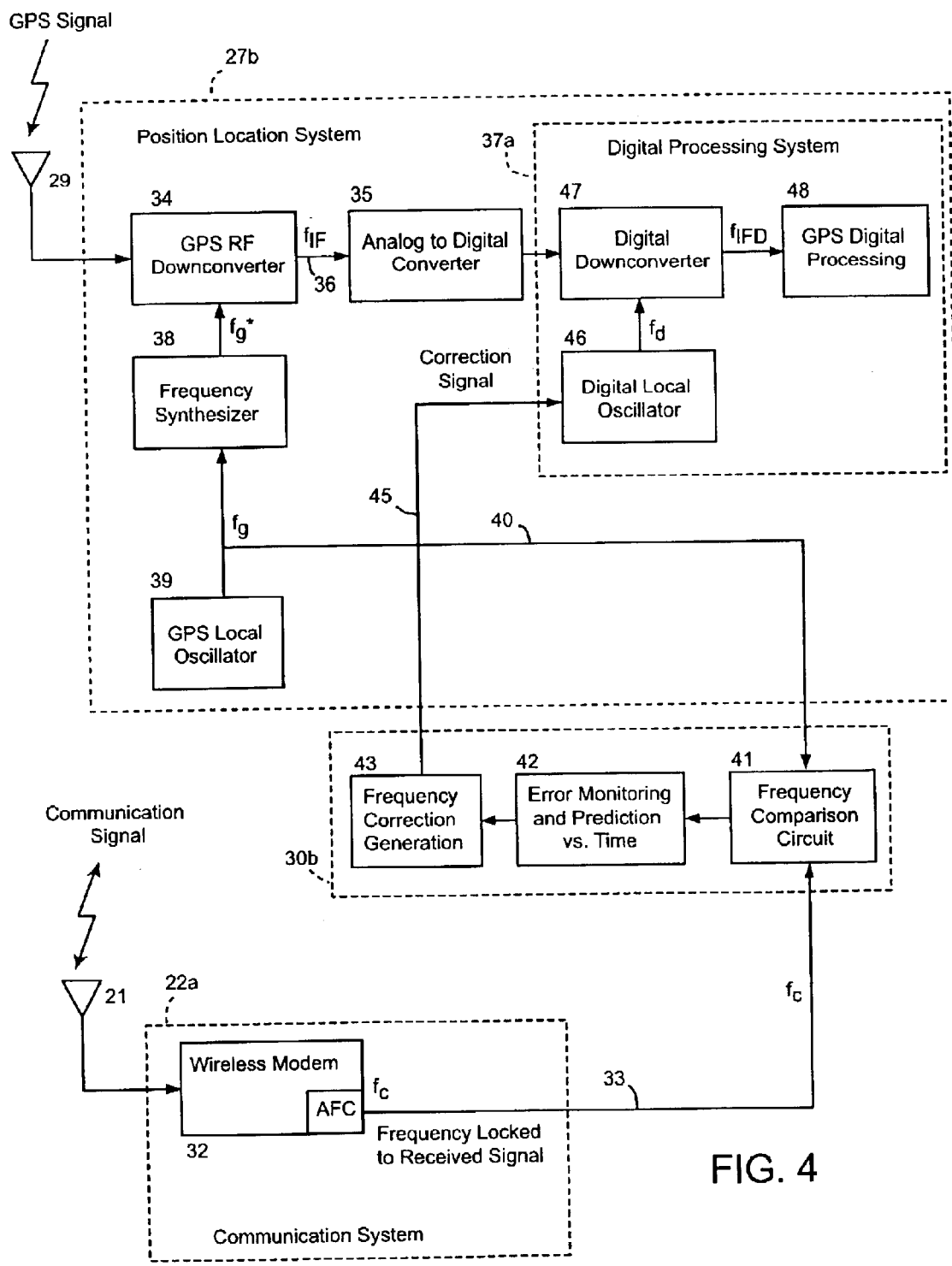
FIG. 4 is a block diagram of another embodiment of the communication system, position location system, and the error prediction and calibration system.

The position location system 27, which in this embodiment is a GPS System, is connected to a GPS antenna 28 to receive GPS signals that are transmitted at or near the ideal GPS frequency. The GPS system 27 comprises any suitable hardware and software for receiving and processing GPS signals and performing any calculations necessary to determine position using any suitable position location algorithm. Examples of GPS system are shown in FIGS. 3 and 4 and described with reference thereto. Other examples of GPS system are disclosed in U.S. Pat. Nos. 5,841,396, 6,002,363, 6,421,002, by Norman F. Krasner. The GPS system 27 includes one or more local oscillators 29 that are used to downconvert the GPS signals from the GPS satellite.

The GPS system 27 is coupled to an error prediction and calibration system 30, thereby allowing transfer of data such as the GPS oscillator frequency $f_g$. As described elsewhere herein in detail, the GPS oscillator frequency $f_g$ is used together with the cellular oscillator frequency $f_c$ to make an error prediction and to generate a correction signal that is supplied to the GPS system 27.

Reference is now made to FIG. 3, which illustrates one embodiment of the position location system 27a, the communication system 22a, and the error prediction and calibration system 30a. Implementations of previously described elements are designated by appending a lowercase letter to the previously discussed reference numeral (e.g. appending "a" to "21" make 21a).

The communication system 22a includes a wireless modem 32 that has an AFC circuit that frequency locks to the received communication signal to provide the cellular oscillator frequency output $f_c$ on a line 33, which is supplied to the error prediction and control system 30a.

The position location system 27a in this embodiment includes a GPS RF-IF downconverter 34 that receives the GPS signal and converts it to a signal at an intermediate frequency $f_{IF}$ on the line 35. The intermediate frequency (IF) signal is supplied to an analog-to-digital converter 36, and then the digital output is supplied to a GPS digital processing system 37 that receives the digital signal and processes it in a manner to provide position location information.

The RF-IF downconverter 34 operates by combining the received GPS signal with a synthesized frequency $f_g^*$ supplied from a frequency synthesizer 38. The result of the combination process in the downconverter is a signal at the intermediate frequency $f_{IF}$; for example, if it is desired that the IF be zero, then the frequency synthesizer must provide a frequency equal to that of the received GPS signal. However, if the synthesized frequency $f_g^*$ supplied by the frequency synthesizer is unequal to frequency of the received GPS signal, then the intermediate frequency $f_{IF}$ will not be zero, but will differ by some amount. And if the intermediate frequency $f_{IF}$ is sufficiently different from the expected GPS frequency, then it may be difficult or even impossible to acquire the GPS signal.

The GPS local oscillator 39 is coupled to supply the GPS local oscillator frequency $f_g$ to the frequency synthesizer 38, which synthesizes the local oscillator frequency $f_g$ to provide the synthesized frequency $f_g^*$, which in turn is used by the downconverter 34 to process the GPS signal. Because the synthesized frequency $f_g^*$ determines the intermediate frequency $f_{IF}$, and the synthesized frequency is synthesized from the GPS oscillator frequency $f_g$, any variations in the GPS local oscillator frequency $f_g$ will also affect the intermediate frequency $f_{IF}$. This effect can be significant due to a multiplier characteristic: a typical frequency synthesizer may multiply the local oscillator frequency by 100× or more. Therefore any error in the local oscillator frequency $f_g$ is multiplied to provide $f_g^*$, and this multiplied error can significantly vary the intermediate frequency $f_{IF}$ from its desired value.

In order to observe and predict errors in the local oscillator and calibrate the GPS receiver with respect to the GPS signal, the error prediction and control system 30a receives the GPS local oscillator frequency, $f_g$, from the GPS local oscillator 39 on a line 40, and also receives the cellular oscillator frequency, $f_c$, on the line 33. A frequency comparison circuit 41 monitors the two frequencies and periodically provides its measurements to the following circuit; for example, the frequency comparison circuit may count over a fixed time interval the number of cycles for each of these two frequencies and provide these numbers directly to the error monitoring and prediction vs. time system 42. Alternatively, the frequency comparison circuit 41 may count the number of zero crossings, which equals 2× the number of cycles, and would improve accuracy due to doubling the number of comparisons. The counted number may be periodically provided in any suitable form, such as a raw count, as a ratio between the two frequencies, or as a frequency difference δf. Various other frequency comparison methods are also possible such as those using spectral analysis methods, such as Fast Fourier Transform methods.

The error prediction value is supplied to the frequency correction generation circuit 43, which generates a correction signal on a line 44. In one embodiment the correction signal is in the form of a scale factor S. The correction signal is supplied to the GPS local oscillator 39, which in response adjusts the output GPS local oscillator frequency $f_g$ to correct for the predicted error.

Reference is now made to FIG. 4, which illustrates an alternative embodiment of the position location system 27 and the error prediction and calibration system 30. In FIG. 4, many of the components are similar to those in FIG. 3; however, the correction signal is supplied on a line 45 to a digital local oscillator 46 in the digital processing system 37a, instead of supplying the correction signal to the GPS local oscillator 39 as in FIG. 3. In FIG. 4, the digital processing system 37a includes a digital downconverter 47 coupled to the digital oscillator 46, to assist the GPS downconverter 34 in demodulating the GPS signal. The digital downconverter 47 receives the digital signal from the A/D converter 35, digitally combines it with the frequency of the digital oscillator 46, and generates a digitally-converted signal at a digital intermediate frequency $f_{IFD}$. A GPS digital processing system 48 then receives the digitally-converted signal, attempts to acquire the GPS signal(s) contained therein, and processes it appropriately.

It may be noted that in the embodiment of FIG. 4, the GPS local oscillator 39 is not coupled to the error correction circuit 30b, and accordingly is not locked to the cellular oscillator frequency. Instead, the GPS local oscillator is allowed normal frequency variations, which will have the effect of varying the intermediate frequency $f_{IF}$ of the signal from the GPS downconverter. The digital local oscillator 46 and the digital downconverter 47 are utilized to convert the intermediate frequency $f_{IF}$ to a new frequency $f_{IFD}$ that corrects an error in the intermediate frequency $f_{IF}$ responsive to the correction signal. Therefore in the embodiment of FIG. 4 the correction signal may not be identical in form with the correction signal in the embodiment of FIG. 3 because they are intended to control different elements. Also, the correction signal in either embodiment may include other adjustments as appropriate in addition to the error correction adjustment.

Figure 5:
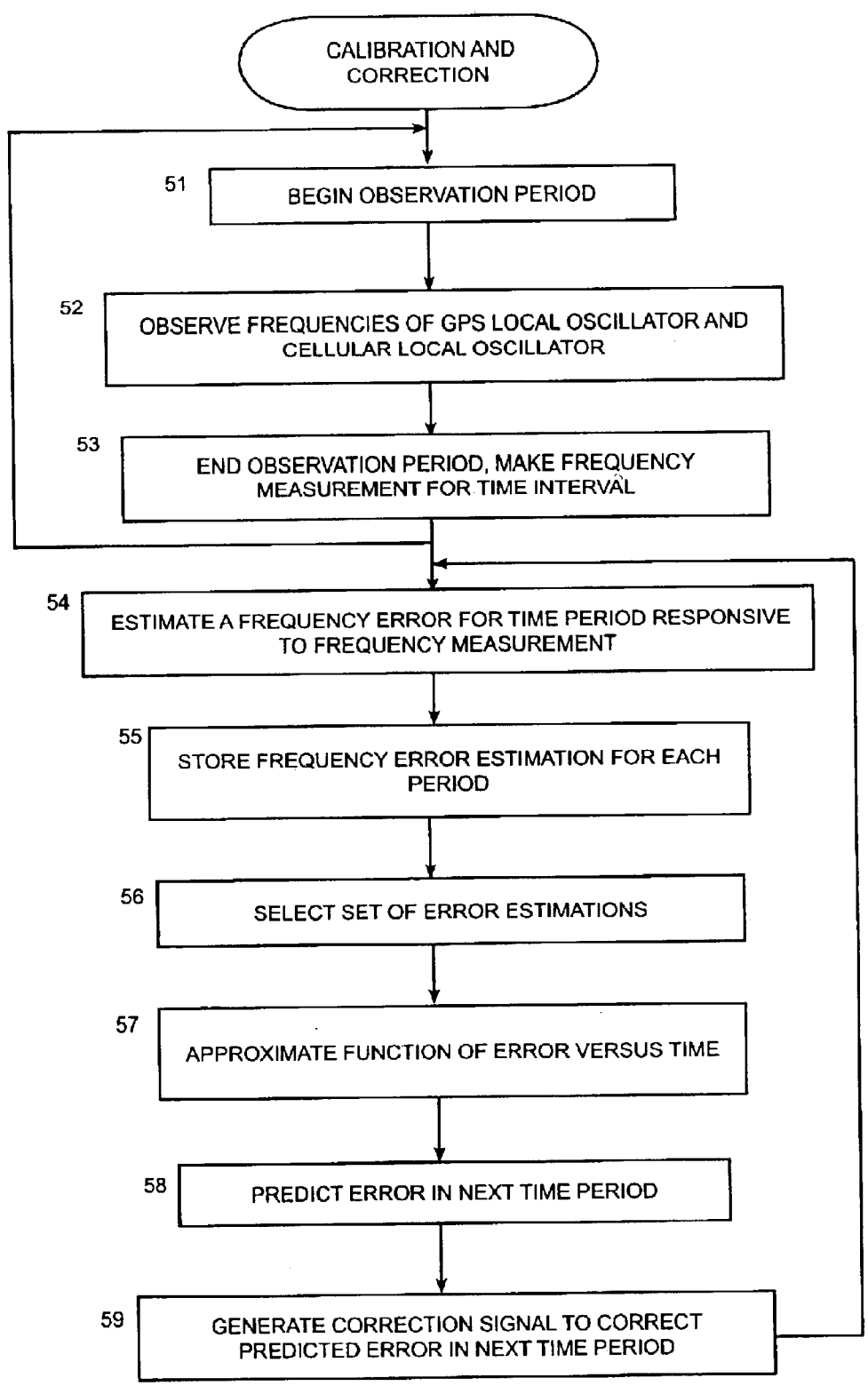
FIG. 5 is a flow chart that shows a series of steps performed to predict an error and generate a correction signal in one embodiment.

Reference is now made to FIG. 5, which is a flow chart that shows a series of steps performed to predict an error and generate a correction signal in one embodiment of the invention. The following discussion with reference to FIG. 5 is intended to provide an overview of the error prediction and calibration method. Various aspects of this method are also described elsewhere in detail, such as with reference to FIGS. 6A to 6D, 7, 8, and 9.

At 51, an observation time interval (period) begins.

At 52, the frequencies of the GPS and the cellular local oscillator are observed. In one embodiment, the GPS and local oscillator frequencies are observed by comparing the difference between the two frequencies. In another, the ratio of the two frequencies is compared.

At 53, at the end of an observation interval a frequency measurement is made. For example, if the observation involves observing the frequency ratio between the GPS and local oscillator signals, then the average frequency ratio observed over that interval, such as by counting, is taken as the measurement. Then, the observation process returns to 51 to begin the next interval and repeat an observation and measurement for each subsequent period. Generally measurements are taken periodically, for example at 0.5 second to 2 second intervals.

At 54, the frequency measurement is used to estimate a frequency error for its respective time period. The frequency error estimation process at 54 may include comparing the frequency ratio during that period with a predetermined constant; for example, since the ratio between the GPS and ideal cellular frequencies is a predetermined constant $R_0$, then the error for the measurement can be estimated by looking at the difference between the predetermined constant and the observed ratio between the two frequencies.

At 55, after the error has been estimated, it is stored in a suitable location, such as a memory in a digital implementation. For example, the error monitoring system 42 (FIGS. 3 and 4) may include a database to store information regarding error estimations for a plurality of time periods.

At 56, a set of error estimations is selected to provide data for the next step, which is the function approximation step. The set may be preselected to include a number of the most recent error estimations, such as the most recent 10 to 20 error estimations.

At 57, a function is approximated using the set of error estimations. For example, a mathematical function may be approximated by methods such as averaging said error estimations in said set; performing a linear regression method utilizing the error estimations in said set; or calculating a least-mean-square curve utilizing the error estimations in said set.

At 58, using the approximated function, a predicted frequency error for the next time interval is determined. For example, the approximated function may be used directly to predict the frequency error in the next time interval.

At 59, the predicted frequency error is used to develop a correction signal that is applied to the appropriate local oscillator for the next time interval. For example, in the implementation of FIG. 3 the correction signal is supplied to the GPS local oscillator 39, and in the implementation of FIG. 4 the correction signal is supplied to the digital local oscillator 46.

Frequency Errors in GPS Oscillator and Cell Phone Master Oscillator

Reference is now made to FIGS. 6A, 6B, 6C, and 6D. The following is an analysis of the frequency errors for two cases. For case 1, the effects of platform motion are assumed minimal and the accuracy of the base station transmitter's carrier frequency is assumed to be essentially perfect. In addition, the base station transmitter's carrier frequency is assumed to be tracked exactly by the cellular phone's oscillator. Case 2 differs in that it assumes that there are variations in the cellular phone's oscillator.

For reference purposes, the oscillator that is frequency locked to the received cell phone signal (or signals) is termed the cell phone master oscillator, and its frequency is referred to as the "cellular reference" or "cellular oscillator" frequency. The oscillator that is used to drive the GPS circuitry is referred to as the "GPS reference" or "GPS oscillator".

Figure 6A:
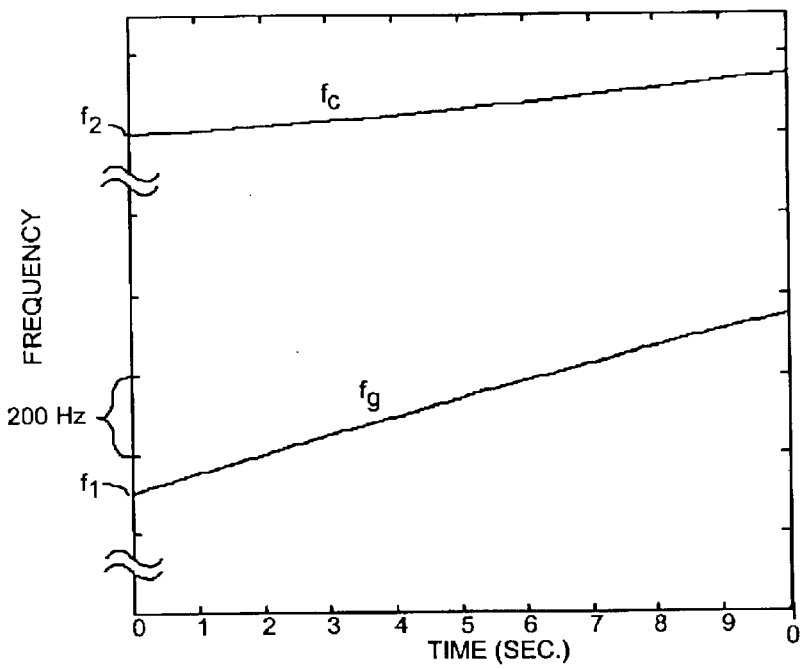
FIG. 6A is a graph of typical frequency variations of cellular and GPS oscillator frequencies in one example.

FIG. 6A is a graph of typical frequency variations of cellular and GPS oscillator frequencies under stressed conditions in one example. As shown in FIG. 6A, the cellular oscillator frequency $f_c$ is increasing from its initial value of $f_1$, and at the same time the GPS oscillator frequency $f_g$ is increasing from its initial value of $f_2$, but at a faster rate. This is typical because the majority of the frequency error is often in the GPS oscillator rather than the cellular oscillator.

Figure 6B:
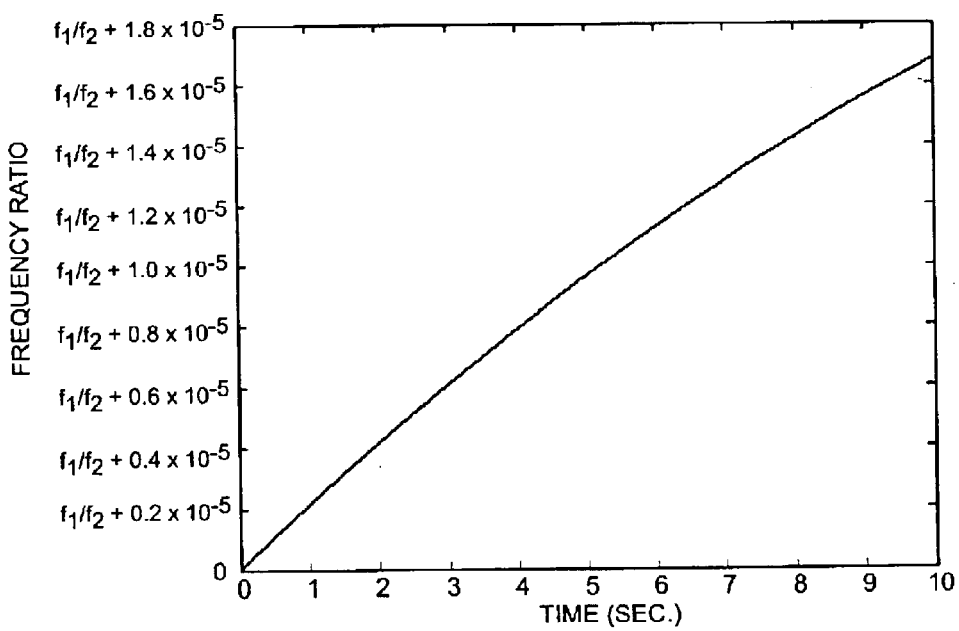
FIG. 6B is a graph that shows the ratio of the GPS oscillator frequency to the cellular oscillator frequency using the frequency observations of FIG. 6A.

FIG. 6B is a graph of the ratio of the GPS oscillator frequency to the cellular oscillator frequency over time using the frequency observations of FIG. 6A. As can be seen, the ratio is a function of both frequencies; however it is typically dominated by the GPS oscillator frequency. Although the ratio is shown as the GPS oscillator frequency divided by the cellular oscillator frequency, the inverse (i.e. the cellular oscillator frequency divided by the GPS oscillator frequency) could be used instead. A detailed discussion relating to frequency measurement and ratio calculation is provided elsewhere herein.

Figure 6C:
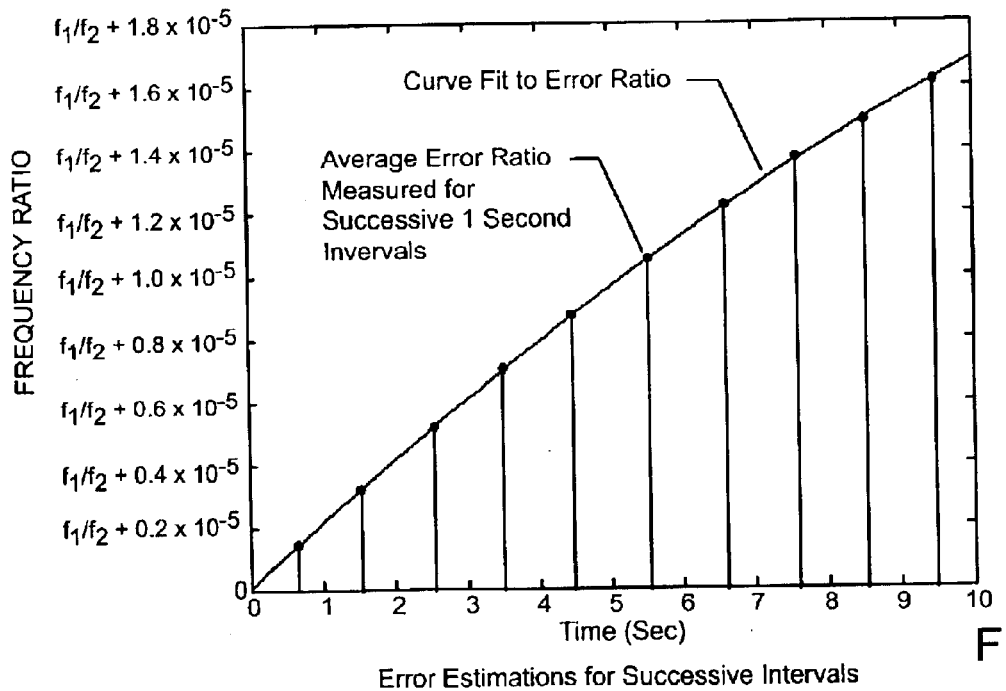
FIG. 6C is a graph of the error estimations using the ratios from FIG. 6B.

FIG. 6C is a graph of the error estimations using the ratios from FIG. 6B. In FIG. 6C the error estimation for each 1 second interval is taken at the midpoint of the time interval; in other embodiments other suitable points may be used for the error estimations. Furthermore, in some embodiments, the frequency measurements and/or error corrections may be utilized to compute a set of calibration corrections, which may then be used in the curve fit procedure to approximate a function.

Figure 6D:
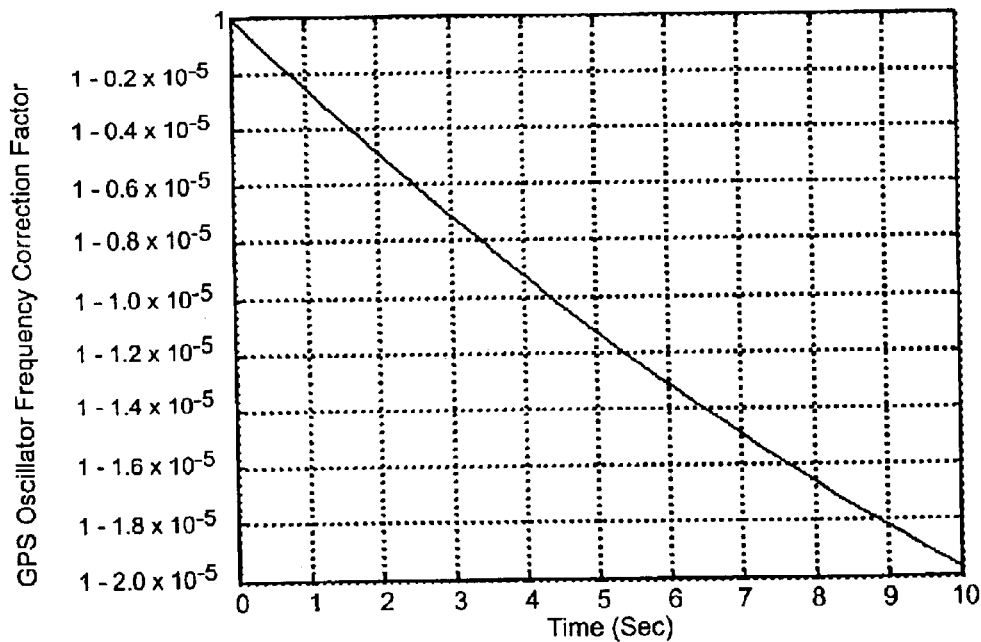
FIG. 6D is a graph showing frequency corrections approximated from the error estimations in FIG. 6C.

FIG. 6D is a graph of the frequency correction curve that is approximated from the error estimations in FIG. 6C. One process for generating the frequency correction curve is described in more detail below. It may be noted that the y-axis has units of a dimensionless "GPS oscillator frequency correction factor", which is a scale factor to be supplied to the GPS oscillator frequency in order to compensate for its errors.

Case 1: Perfect Cellular Oscillator, Imperfect GPS Oscillator

Suppose the mobile oscillator locked to the cell site (the "cellular oscillator") has a first frequency $f_c$ and the mobile oscillator used to drive the GPS circuitry ("the GPS oscillator") has a second frequency $f_g$. Suppose we write:

$$f_g = f_{g0} + \delta f, \quad (1)$$

where $f_{g0}$ is the ideal GPS frequency, which is the desired GPS oscillator frequency, and $\delta f$ is defined as the difference between the ideal GPS frequency and the actual GPS oscillator frequency. One example of the cellular and GPS oscillator frequencies is shown in FIG. 6A.

The ideal GPS frequency bears a specific ratio relative to the ideal cellular frequency:

$$R_0 = f_{g0}/f_{c0}. \quad (2A)$$

If we assume that the cellular oscillator frequency $f_c$ is ideal (i.e. assume $f_c = f_{c0}$), then $$R_0 = f_{g0}/f_c. \quad (2B)$$

FIG. 6B shows the one example of the calculated ratio using the observations from FIG. 6A. In alternative embodiments a similar procedure can be employed in which the ratio of the cellular oscillator frequency to that of the GPS reference oscillator is measured, i.e. we compute the quantity $f_c/f_g$ instead of R (see (3)).

In one example the desired GPS oscillator frequency $f_{g0}$ might be 16.368 MHz and $f_c$ (ideal) might be 19.2 MHz in which case $R_0 = 0.8525$. FIG. 6C is a graph that shows the error measurements for successive intervals, by forming the ratio:

$$R = f_g/f_c = (f_{g0} + \delta f)/f_c = R_0 + \delta f/f_c. \quad (3)$$

Since we know $R_0$ we can subtract it from this ratio (the ratio is measured for example using a frequency counter type operation, as explained below) leaving us with an error ratio $\delta f/f_c$. Of course, with knowledge of $f_c$ we can determine $\delta f$.

To correct for the GPS error in one embodiment the GPS oscillator frequency $f_g$ can be scaled by an amount that produces a frequency $f_{g0}$; that is, we wish to find a scale factor S that produces $S = f_{g0}/f_g$. This scale factor is then computed to be:

$$\begin{aligned} S &= f_{g0}/f_g \\ &= f_{g0}/(f_{g0} + \delta f) \\ &= 1/(1 + \delta f/f_{g0}) \\ &= (1 - \delta f/f_{g0} - (\delta f/f_{g0})^2 - \ldots) \\ &\approx (1 - \delta f/f_{g0}) \end{aligned} \quad (4)$$

where the latter approximation follows from the fact that the fractional error in the oscillator frequency is typically very small (between 10 and 100 PPM). This is computed in one example, and shown in FIG. 6D. We see that for all practical purposes the modification of the GPS frequency is the factor $(1 - \delta f/f_{g0})$. Note that the sign of the scale factor correction is the opposite of the error ratio correction (see equation (3)).

Case 2 Imperfect Cellular and GPS Oscillators

Here we write $$f_g = f_{g0} + \delta f_g,$$

for the GPS oscillator and $$f_c = f_{c0} + \delta f_c,$$

for the cellular oscillator, where $f_{g0}$ and $f_{c0}$ are the ideal GPS and cellular oscillator frequencies, and $\delta f_g$, and $\delta f_c$ are the errors present in each of the oscillators.

Typically these errors vary as a function of time. Then following the analysis for case 1 above we have the ratio of the frequencies:

$$\begin{aligned} R &= f_g/f_c \\ &= (f_{g0} + \delta f_g)/(f_{c0} + \delta f_c) \\ &= f_{g0}/f_{c0}(1 + \delta f_g/f_{g0})/(1 + \delta f_c/f_{c0}) \\ &\approx R_0(1 + \delta f_g/f_{g0})(1 - \delta f_c/f_{c0}) \\ &\approx R_0(1 + \delta f_g/f_{g0} - \delta f_c/f_{c0}) \\ &= R_0 + \delta f_g/f_{c0} - \delta f_c f_{g0}/f_{c0}^2 \end{aligned} \quad (5)$$

where we have neglected higher order terms, which is valid due to the small size of $\delta f_c/f_{c0}$ and $\delta f_g/f_{c0}$. Examining (5) we see that it is identical to (2), except for the last term $-\delta f_c f_{g0}/f_{c0}^2$, which is now nonzero, since we assume $\delta f_c$ is nonzero. We also see that the effect on the ratio of the cellular oscillator error relative to that of GPS oscillator error is proportional the ratios of these two errors, i.e. proportional to $\delta f_c/\delta f_g$. Hence, for example, if the cellular oscillator error (expressed in Hertz) was 10% of the GPS oscillator errors, and the nominal oscillator frequencies were the same, then the effect of the cellular oscillator error would be 1/10 that due to the GPS oscillator by itself.

When we compensate the GPS oscillator error by utilizing an equation based upon only the first two quantities of the right hand side of (5) we will make an error. That is, we typically have no way of measuring $\delta f_c$ and hence we assume that it is zero (although in some cases a long term average will cause short term variations in this quantity to be small). The correction scale factor, similar to (4), for this case is computed would be $(1-\delta f_g/f_{g0})$ if $\delta f_c$ were zero; however we see from (5) that instead of the quantity $+\delta f_g/f_{c0}$ the residual error (after subtracting $R_0$) is $+\delta f_g/f_{c0}-\delta f_c f_{g0}/f_{c0}^2$. Accordingly instead of the correct scale factor $(1-\delta f_g/f_{g0})$, we apply the incorrect scale factor $(1-\delta f_g/f_{g0}\delta f_c/f_{c0})$. Accordingly, the last term is the error term. The ratio of this error term to the second term of this quantity is $-(\delta f_c/\delta f_g)(f_{g0}/f_{c0})$. Typically the latter term is approximately one and hence the ratio of the errors $-(\delta f_c/\delta f_g)$ determines the residual error left after the compensation procedure.

Frequency Measurements

In one embodiment the ratio of the frequencies is computed using a frequency counting type procedure in which, the cellular oscillator is used as a "timebase" and the GPS oscillator is used as the frequency to be counted. Typically a fixed number of cycles of the timebase are counted to establish a time interval.

For example if the cellular oscillator frequency were nominally 19.2 MHz, then counting 19.2 million cycles would establish a time interval of 1 second. During this time interval, the number of cycles, or the number of zero-crossings of the GPS oscillator are counted. The number of cycles of the GPS oscillator counted over this 1 second interval is clearly proportional to the frequency of the GPS oscillator. In fact for this particular example, the number of cycles counted over the 1 second interval would be the estimate of the GPS oscillator frequency in Hertz. Counting zero crossings of this oscillator provides improved accuracy since there are approximately twice as many zero crossings as complete cycles over any interval.

One alternative to the above is to use the GPS oscillator as the timebase, i.e. to establish the counting interval, and then to count the number of cycles or zero-crossings of the cellular oscillator. Obviously this ratio is proportional to the reciprocal of the frequency of the GPS oscillator frequency, i.e. to the period of the GPS oscillator frequency. This method is called the reciprocal counting method, or inverse method, whereas the prior mentioned method is called the direct method.

The direct counting method is normally superior to the reciprocal counting method, when the GPS oscillator frequency exceeds that of the cellular oscillator, and conversely the reciprocal counting method is superior when the cellular oscillator frequency exceeds that of the GPS oscillator frequency.

In alternative embodiment, more precision methods of computing frequency ratios are available, at the expense of more complexity. One of the main sources of error in the above counting procedures is the fact that the number of counts of an oscillator during a time interval is quantized in units of either one cycle or one-half cycle, depending upon the method used. This time quantization effect can be reduced in several ways. In one method, instead of performing a single frequency counting procedure over a period of time T, we perform M counting procedures over adjacent periods of time T/M each, without stopping the counters. Individual count numbers for each of the M intervals will be obtained and this set of numbers can be fit with a linear regression procedure (assuming that the frequency drift is linear) to determine a least-mean square fit to the frequency. This approach will reduce the RMS error due to quantization (and even other sources of noise), by an amount approximately equal to $M^{1/2}$, relative to the procedure that utilizes one time interval of length T.

In another embodiment, the clock from the frequency source to be measured may be treated like an analog signal and is sampled at times determined by the timebase (e.g. at times equal to N clock cycles of the timebase). The data so obtained is Fourier analyzed and will produce a spectral line at a frequency related to that of the reference clock. Various interpolation procedures may be utilized to make a precise estimate of this frequency. This approach also provides improved performance over that of the single interval count method.

Other frequency estimation methods may also be utilized, but the net result is to perform an estimate of the ratio of the frequencies of the cellular and the GPS oscillators.

Linear Regression Example for Approximating a Function

Following is an example of one method for approximating a function of frequency error vs. time. For example, a frequency calibration process can be performed periodically, perhaps at 1 second intervals. A set of error estimations is used to determine frequency rate of change vs. time utilizing linear (or even higher order) regression, which will tend to smooth out a rapid frequency jump, such as +100 to –100 Hz frequency jump that may occur when driving by a cell base station.

If the last m error estimations comprise the set used to determine the frequency drift profile, then in one example the least-mean-square fit to a linear drift is given by:

$$\hat{f}_1 = \frac{\sum_n y_n(n-\bar{n})}{\sum_n n(n-\bar{n})} \quad (6A)$$

$$\hat{f}_0 = \bar{y} - \hat{f}_1 \bar{n} \quad (6B)$$

where $y_n$ are the set of M frequency measurements, each having variance $\sigma^2$, n are the measurement times, $\hat{f}_1$ is the estimate of the linear frequency vs. time characteristic and $\hat{f}_0$ is the estimate of frequency corresponding to the first of the m frequency measurements. The overbar indicates an average of the corresponding quantity. In the presence of random RMS error per measurement of magnitude $\sigma$, the mean-square errors of the measurements of (6) are given by:

$$\mathrm{Var}\hat{f}_1 = \frac{\sigma^2}{\sum_n (n-\bar{n})^2}$$

$$\mathrm{Var}\hat{f}_0 = \frac{\sigma^2}{m}$$

In one embodiment of a multi-mode device, the quantization step sizes of the measurements is ½ cycle of the supplied correction signal (from the cellular oscillator for example). If this signal is 19 MHz, then the quantization step size for a 1 second measurement interval is $1/38e6=2.6\times10^{-8}$. If the error is uniformly distributed over this step size, the RMS error in frequency for a 1 second measurement interval is simply $2.6\times10^{-8}/\sqrt{12}=7.6\times10^{-9}$ which corresponds to 12.0 Hz at the GPS L1 frequency. From (7B) it can be seen that if we process twelve such measurements, the RMS frequency error would be around 3.45 Hz. Furthermore, the error in frequency slope is found from (7A) to be 0.084 times the RMS error per measurement, or $0.084\times7.6\times10^{-9}=6.35\times10^{-10}$ Hz/sec. This corresponds to approximately 1.0 Hz/sec at the GPS L1 frequency. Clearly the calibration method utilizing 12 measurements can produce superior frequency slope measurements. We see that the calibration method itself should be more than adequate to provide the frequency measurement accuracy needed to determine the frequency offset and rate of change of the GPS oscillator. In cases where a linear slope model may not provide an accurate fit, a quadratic slope fit is often appropriate. Particularly, in those cases, a quadratic regression alternative to (6) may work well.

Of course in some embodiments it is possible that the above errors may be dominated by errors in the cellular oscillator rather than the GPS oscillator. However, for CDMA systems the cellular oscillator tracks a cellular signal that in principle achieves long term stability commensurate with cesium standards. In GSM systems, the cellular signal is also very stable, being synchronized to a high quality TCXO. Typically, the dominant source of error in the cellular oscillator is that associated with platform motion.

One advantage of the approach described herein is that the normal frequency variations are usually bounded by the Doppler frequency limits associated with the vehicle motion. Therefore, the following discussion will analyze the deleterious effects of the platform motion upon the estimates.

In some circumstances an issue may arise when using a linear regression approach such as that discussed above. Suppose the uncorrected GPS local oscillator exhibits a linear frequency error versus time. If one observes this error over a period of M time periods, then the resulting correction will be a constant plus a linear function of time. Accordingly, at time period M+1, the corrected GPS local oscillator will exhibit very little error. Hence, if one then performs a linear regression using the errors for the last M periods including the small error at time period M+1, one will get an erroneous result. One way around this problem is to compute for each time period (M+1, M+2, and so forth) the GPS local oscillator frequency that would have been present if the frequency corrections were not made. This is straightforward to do since we need only accumulate the set of GPS local oscillator frequency corrections and subtract these from the current oscillator setting to arrive at the uncorrected frequencies. These uncorrected frequencies may then be applied to the linear (or higher order) regression procedure. Other approaches to avoid the above effect are those based upon closed loop correction procedures in which a fraction of the currently measured error is fed to a filter whose output represent the current correction to the oscillator's control.

Tracking Errors Due to Motion

Figure 7:
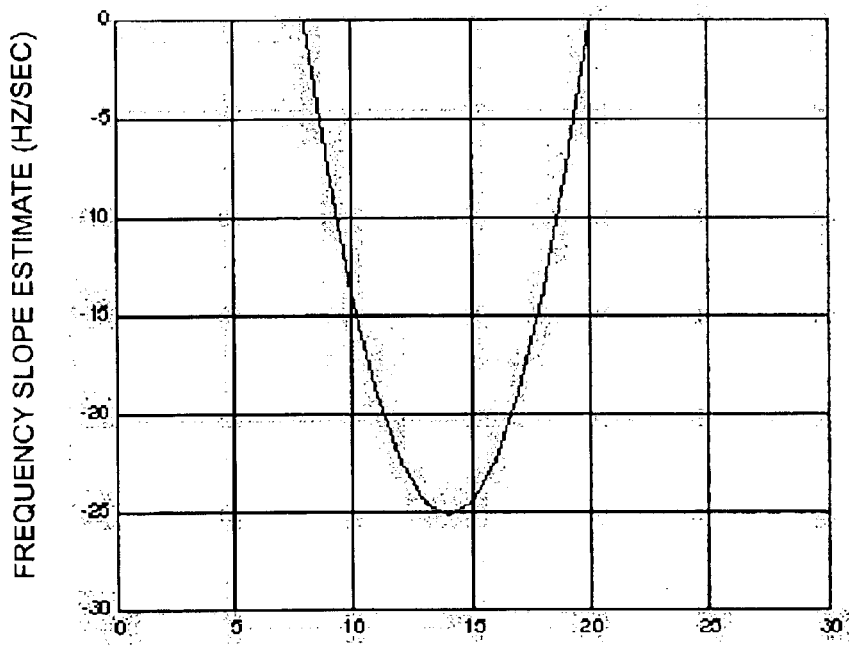
FIG. 7 is a graph of a linear slope estimate resulting from a nearly instantaneous +100 Hz to −100 Hz frequency jump.
Figure 8:
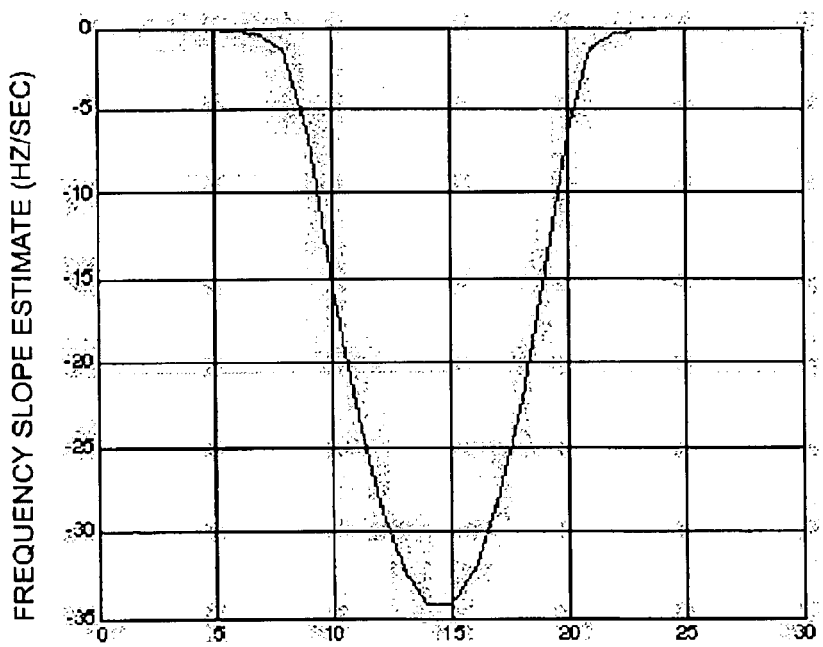
FIG. 8 is a graph that shows a linear slope estimate of an example in which a cell base tower is about 15 meters from the roadway and about 15 meters high.
Figure 9:
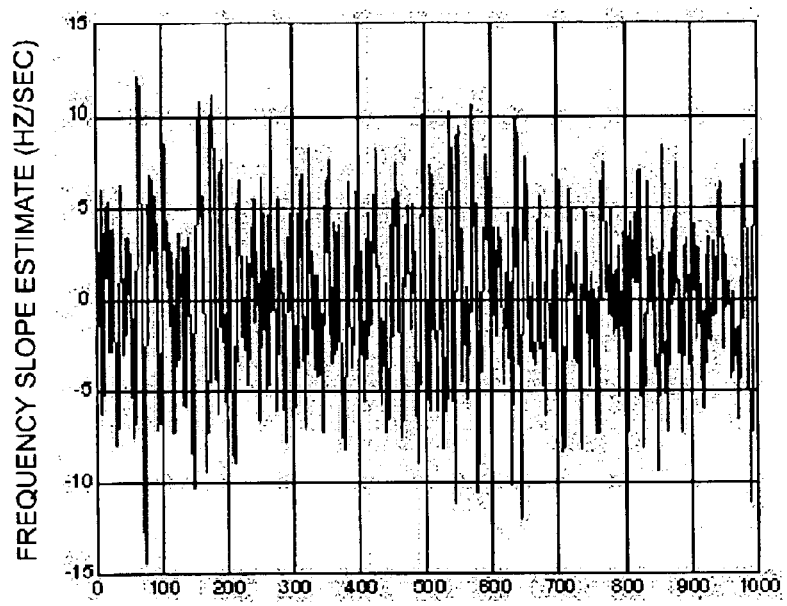
FIG. 9 is a graph that shows a linear slope estimate for random frequency data normally distributed.

Reference is now made to FIGS. 7, 8, and 9 to illustrate an analysis of vehicle motion in the context of the error calibration approach described herein. Motion should be of consequence only for vehicular speeds; at pedestrian speeds, for example 1.0 meter/second, the maximum Doppler at L1 frequency is only 5.3 Hz and significant acceleration is not common. Such small Dopplers should negligibly affect tracking performance.

Rapid Frequency Jumps Due to Vehicle Passing Near Cell Tower

FIG. 7 is a graph showing a linear slope estimate resulting from a nearly instantaneous +100 Hz to −100 Hz frequency jump. Particularly, in FIG. 7, the observed Doppler from a cell tower, as computed for the GPS frequency, changes from +100 Hz to −100 Hz in one second. This could occur for example if the cell base station tower is immediately next to a roadway across which an automobile is traveling at around 42 miles per hour. This of course can be scaled up for higher speed vehicles. However, normally the cell tower is much further from the highway and hence it would not be typical to observe such an abrupt change in frequency; instead it is more likely to observe a smoothly changing Doppler, perhaps over several seconds. This more realistic situation is analyzed shortly.

Assume we use the procedure described in the previous section and we use 12 calibration measurements together with the linear regression fit. With the above assumptions, if we did not use the linear regression fit, we might observe a rapid change in frequency of 200 Hz/sec, maximum. The smoothing effect of the linear regression, however, is shown in FIG. 7.

To obtain the curve of FIG. 7 running estimates of frequency slope vs. time were performed utilizing a set of twelve measurements in the absence of added noise or any other linear slopes. As can be seen in the figure the maximum error in slope estimate is about −25.1 Hz.

If +100 to −100 Hz jump were present together with an additional linear slope (e.g. due to oscillator drift), then the estimator error will still be identical to that shown in FIG. 7. In one experiment, the performance loss for 25 Hz frequency slope error is analyzed and the output SNR loss is found to be only about 0.6 dB for the typical settings used during high sensitivity tracking. The discussion of the prior section also illustrates that the quantization related errors in slope estimation are insignificant compared to this error.

FIG. 8 is a graph that shows a linear slope estimate of a somewhat more realistic situation in which a cell base station tower is about 15 meters from the roadway and about 15 meters high and a vehicle is traveling at 60 miles per hour (27 meters per second). This is a relatively low cell tower close to the highway. This results in an excursion in Doppler from +142 Hz to −142 over a period of several seconds. The resulting linear slope estimate is shown in FIG. 8. It is also assumed that only the direct pilot from the cell tower is utilized for the AFC measurement (i.e. not weighted by other reflected pilots). The presence of additional pilots will typically improve the situation. In the single pilot case one sees that the worst case estimate is in error by about 34.2 Hz. One analysis has shown that the degradation in output SNR for this case to be about 1.13 dB.

Random Fluctuations Due to Pilot Tone Power Variations

The celltower situation analyzed above with reference to FIG. 8 is expected to be a worst case situation under most conditions. Other situations of interest include those in which several pilot signals are received and combined to control the AFC loop. One or the other such pilots may dominate as a function of time, causing the AFC to shift around. However, one would expect this rapid shifting to be most prominent in heavy urban environments where vehicle speed is normally expected to be substantially less than that analyzed above. In addition random fluctuations of the AFC as a function of time will tend to cause an averaging effect that reduces the frequency slope excursions.

FIG. 9 is a graph that depicts the linear slope estimate for random frequency data normally distributed. Suppose the effects of the vehicle motion cause the AFC frequency to wander about the range [−50 Hz, 50 Hz] with a random value every second. Then a simulation over 1000 seconds of this situation produces a frequency slope estimate shown in FIG. 9. Analysis of this simulation with the prior 12 measurement linear regression indicates an RMS slope estimate error of 4.2 Hz, which is consistent with the prediction from (7A) that would be 4.18 Hz for this case. This small error causes negligible performance loss.

3. Further Comments and Improvements

Various modifications of the above linear regression may be utilized to further improve the above results. For example, special filtering may be done on the calibration samples. In one scenario above, the frequency vs. time function is basically a step function, and thus, if one differentiates a step function the result will be a large spike that can be filtered out via a suitable thresholding technique. A further integration operation yields the calibration samples with the frequency step function removed. Alternative methods may be developed based upon recognizing certain "patterns" of calibration values vs. time that are most likely associated with expected conditions. Also, it should be clear the system described herein applies generally to any positioning system for example the Russian Glosnass System, the planned European Galileo System, the U.S. Global Positioning System, and any other Satellite Positioning System.

It will be appreciated by those skilled in the art, in view of these teachings, that alternative embodiments may be implemented without deviating from the spirit or scope of the invention. This invention is to be limited only by the following claims, which include all such embodiments and modifications when viewed in conjunction with the above specification and accompanying drawings.

What is claimed is:

1. A method of correcting a GPS receiver comprising:
   producing a first frequency locked to a cellular network signal;
   generating a second frequency in a GPS oscillator during a first time period;
   computing a first error based upon comparisons of said first and second frequencies during said first time period;
   computing a second error base upon comparisons of said first and second frequencies during a second time period;
   providing an error function from said first and second errors;
   predicting a GPS oscillator error using said error function for a next time period; and
   correcting said GPS oscillator in said next time period responsive to said predicted GPS oscillator error.

2. The method of claim 1 further comprising repeating said method during operation.

3. The method of claim 1 wherein said includes providing an error function comprises fitting a mathematical function to said first and second error computations.

4. The method of claim 1 wherein said correcting comprises correcting a GPS local oscillator that supplies said second frequency to convert said GPS signal into a predetermined intermediate frequency.

5. The method of claim 1 wherein said GPS oscillator is a digital local oscillator, and said correcting comprises correcting said digital local oscillator.

6. A method of correcting a GPS receiver in a mobile device using a cellular network signal having a predefined precision carrier frequency, to receive a GPS signal transmitted at a predefined GPS frequency, comprising:
   generating a first frequency signal responsive to said precision carrier frequency;
   generating a second frequency signal in said GPS receiver, to process said GPS signal;
   computing an error between said first and second frequencies in a first time period;
   repeating said error computing at least once during at least a second respective time period to provide a set of error estimations;
   providing an error function of said second frequency directly from said set of error computations;
   predicting an error in a next time period following said repeating utilizing said error function; and
   correcting said second frequency to process said GPS signal in said next time.

7. The method of claim 6 wherein said computing an error comprises measuring a ratio of said second and said first frequencies for each of said time periods, and for each time period comparing this ratio to a predetermined number.

8. The method of claim 6 wherein said error prediction includes determining a frequency error vs. time of said second frequency by fitting mathematical function to said set of error estimations.

9. The method of claim 6 wherein said error prediction comprises one of:
   averaging said set of error estimations; and
   performing a mathematical regression method utilizing said set of error computations to produce a least-mean-square fit to said set of error estimations.

10. The method of claim 6 wherein said cellular network signal is provided by a cellular base station, said mobile device comprises a cellular transceiver, and further comprising:
    frequency-locking said precision carrier frequency to provide said first frequency; and
    communicating between said mobile device and said cellular base station.

11. The method of claim 6 further comprising extracting a precision carrier frequency from said cellular network signal to provide said first frequency.

12. The method of claim 6 wherein said correcting comprises correcting a GPS local oscillator that supplies said second frequency to convert said GPS signal at said GPS frequency into a predetermined intermediate frequency.

13. The method of claim 6 wherein said GPS receiver comprises a digital local oscillator, and said correcting comprises correcting said digital local oscillator.

14. A method of correcting a GPS receiver in a mobile device to receive a GPS signal transmitted at a predefined GPS frequency using a communication signal transmitted from a cellular base station, said communication signal including a predefined precision carrier frequency, comprising:
    synchronizing a first local oscillator to the precision carrier frequency to generate a first frequency;
    generating a second frequency signal in said GPS receiver having a nominal value close to a predetermined value, said second frequency signal applied to process said GPS signal;
    monitoring said first and second frequencies over a plurality of time periods to provide a frequency measurement for each of said plurality of time periods;
    computing an error in said first and second frequencies for each monitored time period to provide a set of error estimations;

providing a frequency error vs. time function for said second frequency by fitting a mathematical function responsive to said set of error estimations;

predicting an error in a next time period utilizing said function;

developing a correction signal for said next time period responsive to said predicted error; and processing said GPS signal responsive to said correction signal.

15. The method of claim 14 wherein said monitoring comprises repeatedly measuring a ratio of said second and said first frequencies over a plurality of time periods, and for each time period comparing this ratio to a predetermined number to compute said error.

16. The method of claim 14 wherein said error prediction comprises one of:

averaging said error computations in said set;

performing a mathematical regression method utilizing the error computations in said set in order to calculate a least-mean-square curve to said error estimations computations.

17. The method of claim 14 further comprising correcting a frequency of a GPS local oscillator that supplies said second frequency to convert said GPS signal at said GPS frequency into a predetermined intermediate frequency, responsive to said correction signal.

18. The method of claim 14 wherein said GPS receiver comprises a digital local oscillator, and further comprising correcting a frequency output from said digital local oscillator responsive to said correction signal.

19. A multiple function portable device for providing cellular communication using a network of cellular stations that operate at predefined ideal cellular frequencies, and also for providing position location using GPS satellites that transmit GPS signals at a predefined GPS frequency, comprising:

a cellular communication system including a first local oscillator that generates a first frequency for demodulating communications with said network of cellular stations;

a GPS system including a second local oscillator that generates a second frequency coupled to process said GPS signals;

an error prediction and correction system that predicts an error in a next time period according to an error function representing measurements of said first and second frequencies over a plurality of previous time periods, said system also generating a correction signal for said next time period responsive to said predicted error; and said second local oscillator receiving said correction signal and responsive thereto processes said GPS signal during said next time period.

20. The multiple function portable device of claim 19 wherein said error prediction and correction system comprises:

a frequency comparison circuit;

an error monitor and prediction circuit; and a frequency correction generation circuit.

21. The multiple function portable device of claim 20 wherein said frequency comparison circuit includes:

means for monitoring said first and second frequencies and periodically providing measurements indicative of difference between said first and second frequencies during an observation period, and said error monitor and prediction circuit periodically compares each said measurement with a predetermined number to provide an error estimation for each time period.

22. The multiple function portable device of claim 20 wherein said error function is a mathematical function and said monitor and prediction circuit comprises a system for approximating said mathematical function according to said plurality of error estimations.

23. The multiple function portable device of claim 22 wherein said approximating system comprises one of:

means for averaging said error estimations over a predefined number of periods;

means for performing a mathematical regression method utilizing said error estimations over a predefined number of periods of time to calculate a least-mean-square of said error estimations over said plurality of periods of time.

24. The multiple function portable device of claim 19 wherein said second local oscillator comprises a digital local oscillator that is utilized in the digit frequency translation of a GPS signal.

* * * * *